United States Patent
Minamio et al.

(10) Patent No.: US 7,338,838 B2
(45) Date of Patent: Mar. 4, 2008

(54) RESIN-ENCAPSULATION SEMICONDUCTOR DEVICE AND METHOD FOR FABRICATING THE SAME

(75) Inventors: Masanori Minamio, Osaka (JP); Toru Nomura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 436 days.

(21) Appl. No.: 11/090,011

(22) Filed: Mar. 28, 2005

(65) Prior Publication Data

US 2005/0167855 A1    Aug. 4, 2005

Related U.S. Application Data

(62) Division of application No. 10/199,109, filed on Jul. 22, 2002, now Pat. No. 6,909,168.

(30) Foreign Application Priority Data

Jul. 23, 2001    (JP) .............................. 2001-221118

(51) Int. Cl.
  *H01L 21/44*    (2006.01)
  *H01L 21/48*    (2006.01)
  *H01L 21/50*    (2006.01)
  *H01L 21/82*    (2006.01)

(52) U.S. Cl. ..................... 438/111; 438/106; 438/112; 438/123

(58) Field of Classification Search ............... 257/666, 257/669, 676; 438/111, 106
See application file for complete search history.

(56) References Cited

U.S. PATENT DOCUMENTS

| | | | | |
|---|---|---|---|---|
| 6,081,029 A * | 6/2000 | Yamaguchi | ................ | 257/718 |
| 6,166,430 A * | 12/2000 | Yamaguchi | ................ | 257/666 |
| 6,204,553 B1 | 3/2001 | Liu et al. | | |
| 6,400,004 B1 | 6/2002 | Fan et al. | | |
| 6,501,156 B1 * | 12/2002 | Nakanishi et al. | .......... | 257/666 |
| 6,638,790 B2 | 10/2003 | Minamio et al. | | |
| 6,642,609 B1 | 11/2003 | Minamio et al. | | |
| 6,650,020 B2 | 11/2003 | Yamada et al. | | |
| 2003/0127711 A1* | 7/2003 | Kawai et al. | ................ | 257/666 |
| 2004/0089921 A1* | 5/2004 | Minamio et al. | ............ | 257/666 |
| 2005/0110121 A1* | 5/2005 | Minamio et al. | ............ | 257/669 |

FOREIGN PATENT DOCUMENTS

| | | |
|---|---|---|
| JP | 08250641 A | 9/1996 |
| JP | 11-195733 | 7/1999 |
| JP | 11-214606 | 8/1999 |
| JP | 2000-012758 A | 1/2000 |
| JP | 2001-345411 A | 12/2001 |

* cited by examiner

*Primary Examiner*—Michael Lebentritt
*Assistant Examiner*—Kenisha V Ford
(74) *Attorney, Agent, or Firm*—McDermott Will & Emery LLP

(57) ABSTRACT

A resin-encapsulation semiconductor device of this invention includes a die pad for mounting a semiconductor element; a plurality of supporting leads; a semiconductor element; a plurality of leads disposed to have tips thereof opposing the die pad; metal wires; and an encapsulation resin for encapsulating the die pad excluding a bottom thereof, the leads excluding bottoms and outside edges thereof, connecting regions with the metal wires, the supporting leads and the semiconductor element. The outside edges of the leads are disposed on substantially the same plane as the side face of the encapsulation resin, and the tip of each lead has a thin portion where the thickness is reduced in an upper face thereof.

5 Claims, 9 Drawing Sheets

RESIN-ENCAPSULATION SEMICONDUCTOR DEVICE AND METHOD FOR FABRICATING THE SAME

This application is a divisional of application Ser. No. 10/199,109, filed on Jul. 22, 2002 now U.S. Pat. No. 6,909,168.

BACKGROUND OF THE INVENTION

The present invention relates to a resin-encapsulation semiconductor device using a lead frame and a method for fabricating the same. More particularly, it relates to a resin-encapsulation semiconductor device in which a die pad for mounting a semiconductor element is exposed from an encapsulation resin and a method for fabricating the same, and furthermore, it relates to a thin and highly reliable resin-encapsulation semiconductor device in which a semiconductor element with a large package area ratio can be packaged and a method for fabricating the same.

Recently, in order to cope with downsizing of electronic equipment, semiconductor components such as a resin-encapsulation semiconductor device are required to have a high packaging density. Also in accordance with the downsizing, the semiconductor components have become small and thin. Furthermore, the semiconductor components are required to have a multi-pin structure in spite of their compactness and small thickness, and there is a demand for a compact and thin resin-encapsulation semiconductor device with a high density.

Now, a conventional resin-encapsulation semiconductor device with an exposed die pad will be described with reference to FIGS. 8A through 8C. FIG. 8A is a plan view of the conventional resin-encapsulation semiconductor device, FIG. 8B is a bottom view thereof and FIG. 8C is a cross-sectional view thereof taken along line VIIIC-VIIIC' of FIG. 8B.

As shown in FIGS. 8A through 8C, in the conventional resin-encapsulation semiconductor device, a semiconductor element 102 is mounted on a support 101a formed on a die pad 101 of a lead frame, and the semiconductor element 102 is electrically connected to inner leads 103 through metal wires 104. The resin-encapsulation semiconductor device of FIGS. 8A through 8C has an exposed die pad with the semiconductor element 102 disposed on the die pad 101 and the inner leads 103 encapsulated within an encapsulation resin 105, a side face of the encapsulation resin 105 and the outside edges (ends) of the inner leads 103 are disposed on the same plane, and the bottom of the die pad 101 is exposed from the encapsulation resin 105.

The die pad 101 has the support 101a elevated within its plane, and the support 101a is formed by pressing above a semi-cut plate portion of the die pad 101. In other words, the resin-encapsulation semiconductor device shown in FIGS. 8A through 8C has an upset structure for placing the bottom of the mounted semiconductor element at a higher level than the upper faces of the inner leads 103. Each metal wire 104 connected to the semiconductor element 102 is connected to a portion in the vicinity of a groove 103a formed on the upper face of the inner lead 103.

In the bottom view of FIG. 8B, portions exposed at the respective corners of the encapsulation resin 105 of the package correspond to exposed bases of supporting leads 106 supporting the die pad 101.

Next, a method for fabricating the conventional resin-encapsulation semiconductor device will be described with reference to FIGS. 9A, 9B and 10A through 10D.

FIGS. 9A and 9B show a lead frame for use in the fabrication of the conventional resin-encapsulation semiconductor device. FIG. 9A is a plan view of the lead frame and FIG. 9B is a cross-sectional view thereof taken along line IXB-IXB' of FIG. 9A. FIGS. 10A through 10D are cross-sectional views for showing procedures in the fabrication of the conventional resin-encapsulation semiconductor device using the lead frame of FIGS. 9A and 9B.

First, the lead frame for use in the fabrication of the conventional resin-encapsulation semiconductor device will be described.

As shown in FIGS. 9A and 9B, the conventional lead frame includes a die pad 101, supporting leads 106 and a plurality of inner leads 103. The die pad 101 has, within its plane, a support 101a provided inside a plate-like outer frame made from a metal plate for mounting a semiconductor element. Each supporting lead 106 supports the die pad 101 at the tip thereof and is connected to the outer frame at the base thereof. The tips of the plural inner leads 103 are respectively arranged so as to oppose the sides of the die pad 101, and the bases of the plural inner leads 103 are connected to the outer frame. A plurality of grooves 103a are formed on the upper face of each inner lead, and the tip of each inner lead is tapered. The conventional lead frame has a thickness of approximately 200 through 300 μm.

A plurality of lead frames each having the structure as shown in FIGS. 9A and 9B are continuously formed in a matrix inside one outer frame.

Next, the method for fabricating the conventional resin-encapsulation semiconductor device using this lead frame will be described.

First, as shown in FIG. 10A, the above-described lead frame is prepared. Specifically, the prepared lead frame includes, inside the metal plate outer frame, as shown in FIGS. 9A and 9B, the rectangular die pad 101 having, on the upper face thereof, the support 101a for mounting a semiconductor element; the supporting leads for supporting the die pad 101; and the inner leads 103 in the shape of beams to be electrically connected to the mounted semiconductor element through connecting means such as metal wires.

Next, as shown in FIG. 10B, a semiconductor element 102 is bonded onto the support 101a of the die pad 101 of the lead frame with an adhesive such as a silver paste (which procedure is designated as a die bonding step).

Then, as shown in FIG. 10C, each electrode pad (not shown) disposed on the upper face of the semiconductor element 102 mounted on the die pad 101 is connected to an upper portion at the tip of the inner lead 103 of the lead frame through a metal wire 104 (which procedure is designated as a wire bonding step). In this case, the metal wire 104 is connected to a space between the grooves 103a provided on the upper face of the inner lead 103.

Thereafter, as shown in FIG. 10D, the die pad 101, the semiconductor element 102 and the inner leads 103 are encapsulated within an encapsulation resin 105 with an encapsulation sheet adhered onto the bottom of the lead frame.

This procedure is performed so as to individually encapsulate each semiconductor element disposed on the lead frame and not to entirely encapsulate the whole upper face of the lead frame. Also, since the encapsulation sheet is adhered onto the bottom of the lead frame in this procedure, an encapsulated region includes the die pad 101 excluding the bottom thereof, the supporting leads, the semiconductor element 102, the inner leads excluding the bottoms thereof and connecting regions with the metal wires 104, and hence, the bottom of the die pad 101 is exposed from the bottom of the encapsulation resin 105 after the encapsulation.

After the encapsulation, the bases of the supporting leads and the inner leads 103 connected to the outer frame are cut, resulting in obtaining a resin-encapsulation semiconductor device in which the ends (the outside edges) of the supporting leads and the inner leads 103 are disposed on substantially the same plane as the side face of the encapsulation resin 105.

However, the present inventors have found, through examination on the structure of and the fabrication method for the conventional resin-encapsulation semiconductor device, the following: Since the conventional die pad has the elevated support formed by the semi-cut pressing, when a semiconductor element is disposed on the support of the die pad, the entire thickness of the resin-encapsulation semiconductor device is increased by a thickness corresponding to the upsetting extent of the support, which can be a restriction in attaining a desired small thickness. In particular, when a large semiconductor element is packaged, the thickness of the resin-encapsulation semiconductor device is greatly affected, and hence, it is impossible to attain, by using this structure, a small thickness with a large semiconductor element packaged.

Furthermore, the inner leads are encapsulated substantially on the single side, and hence, external impact or stress caused within the encapsulation resin may apply stress to the metal wires connected onto the inner leads, so that there may be fear of break and degradation of the reliability in the connection. In the conventional resin-encapsulation semiconductor device, a plurality of grooves are provided on the upper face of each inner lead and the metal wire is connected to a space between the grooves, so as to cancel or release the applied stress. However, in consideration of the area of each lead included in a small package, it is very difficult to form a plurality of grooves on each inner lead and further secure a bonding area for the connection to a metal wire. In addition, in the resin-encapsulation semiconductor device with the one side encapsulation structure, it is necessary, in accordance with the downsizing of leads, to improve the connection reliability of metal wires.

Also, in the conventional method for fabricating the resin-encapsulation semiconductor device, in particular, in the resin encapsulating procedure, the entire lead frame is not encapsulated but the semiconductor elements disposed within the lead frame are individually encapsulated. Therefore, in order to separate each resin-encapsulation semiconductor device from the lead frame after the encapsulation, it is necessary to cut the lead frame with a mold, which can be an obstacle to improve the fabrication efficiency.

The present invention was devised in consideration of these disadvantages, and a principal object is providing a resin-encapsulation semiconductor device in which a larger semiconductor element is packaged to increase the package area ratio for realizing a CSP (chip size package) while suppressing increase in the thickness of the resin-encapsulation semiconductor device itself, and a method for fabricating the same.

SUMMARY OF THE INVENTION

The resin-encapsulation semiconductor device of this invention includes a die pad for mounting a semiconductor element; a plurality of supporting leads for supporting the die pad; a semiconductor element mounted on the die pad; a plurality of leads arranged to have tips thereof opposing the die pad; metal wires for respectively connecting electrodes of the semiconductor element to upper faces of the leads; and an encapsulation resin for encapsulating the die pad excluding a bottom thereof, the leads excluding bottoms and outside edges thereof, connecting regions with the metal wires, the supporting leads and the semiconductor element, and the outside edges of the leads are disposed on substantially the same plane as a side face of the encapsulation resin, and each of the tips of the leads opposing the die pad has a thin portion where a thickness is reduced in an upper face thereof.

In one aspect, the thin portion of each of the tips of the leads has the thickness reduced to substantially a half of a thickness of the leads.

In one aspect, the thin portion of each of the tips of the leads has a gently inclined face formed by reducing the thickness in the upper face thereof to substantially a half of a thickness of the leads.

In one aspect, a periphery of the semiconductor element mounted on the die pad is close to the thin portions of the tips of the leads.

In one aspect, a groove is provided on the upper face of each of the leads.

In one aspect, each of the metal wires for connecting the electrodes of the semiconductor element to the upper faces of the leads is connected to a portion on the upper face of each of the leads in a position close to the groove provided thereon.

In one aspect, a groove is provided on the bottom of the die pad.

In one aspect, each of the metal wires for connecting the electrodes of the semiconductor element to the upper faces of the leads is connected to a portion on the upper face of each of the leads in a position away from the thin portion.

In one aspect, an upper face of the die pad is disposed at the same level as the upper faces of the leads excluding the thin portions.

In one aspect, the resin-encapsulation semiconductor device is in a rectangular parallelepiped shape.

The method for fabricating a resin-encapsulation semiconductor device of this invention includes the steps of preparing a lead frame including a die pad provided inside an outer frame made from a plate material for mounting a semiconductor element, supporting leads supporting the die pad at tips thereof and connected to the outer frame at bases thereof, and a plurality of leads arranged to have tips thereof opposing the die pad, connected to the outer frame at bases thereof and having, at the tips thereof, thin portions having a reduced thickness in upper faces thereof; mounting, on the die pad of the prepared lead frame, a semiconductor element having a principal plane where electrodes are disposed, with the principal plane thereof facing upward; connecting, through metal wires, the electrodes of the semiconductor element mounted on the die pad to upper faces of the leads of the lead frame in positions other than upper faces of the thin portions; and resin encapsulating an upper face of the lead frame with an encapsulation resin for encapsulating the die pad excluding a bottom thereof, the leads excluding bottoms thereof, connecting regions with the metal wires, the supporting leads and the semiconductor element.

In one aspect, the method for fabricating a resin-encapsulation semiconductor device further includes, after the step of resin encapsulating, a step of cutting the bases of the supporting leads and the leads, whereby disposing outside edges of the supporting leads and the leads in substantially the same plane as a side face of the encapsulation resin.

In one aspect, in the step of mounting a semiconductor element on the die pad, the semiconductor element has such a size as to have a periphery thereof close to the thin portions of the tips of the leads of the lead frame.

The other method for fabricating a resin-encapsulation semiconductor device of this invention includes the steps of preparing a lead frame including a plurality of lead units provided inside an outer frame made from a plate material, each of the lead units including a die pad for mounting a semiconductor element, supporting leads supporting the die pad at tips thereof and connected to the outer frame at bases thereof, and a plurality of leads arranged to have tips thereof opposing the die pad, connected to the outer frame at bases thereof and having, at the tips thereof, thin portions having a reduced thickness in upper faces thereof, and the outer frame having a reduced thickness between the lead units; mounting, on each die pad of the prepared lead frame, a semiconductor element having a principal plane where electrodes are disposed, with the principal plane thereof facing upward; connecting, through metal wires, the electrodes of the semiconductor element mounted on the die pad to upper faces of the leads of the lead frame in positions other than upper faces of the thin portions; resin encapsulating an upper face of the lead frame over the lead unites with an encapsulation resin for encapsulating the die pad excluding a bottom thereof, the leads excluding bottoms thereof, connecting regions with the metal wires, the supporting leads and the semiconductor element; and cutting the bases of the supporting leads and the leads by cutting the lead frame in portions where the outer frame has the reduced thickness between the lead units, whereby obtaining resin-encapsulation semiconductor devices each of which is in a rectangular parallelepiped shape and has outside edges of the supporting leads and the leads disposed in substantially the same plane as a side face of the encapsulation resin.

In one aspect, in the step of mounting a semiconductor element, the semiconductor element has such a size as to have a periphery thereof close to the thin portions of the tips of the leads of the lead frame.

According to the resin-encapsulation semiconductor device of this invention, since the tips of the leads opposing the die pad have the thin portions with the reduced thickness in the upper faces thereof, even when the upper face of the die pad is placed at the same level as the upper faces of the leads, the periphery of the semiconductor element mounted on the die pad can be close to the thin portions on the tip upper faces of the leads. As a result, while avoiding contact between the leads and the semiconductor element, a large semiconductor element can be mounted for realizing a CSP. Also, since the tips of the leads have the thin portions, there is no need to upset the semiconductor element by providing an elevated support on the die pad. Therefore, the chip area ratio can be increased so as to realize a resin-encapsulation semiconductor device with a small thickness. According to the resin-encapsulation semiconductor device of this invention, the chip area ratio in the package (encapsulation resin) can be increased to 70% or more, so as to realize a CSP.

In addition, in the case where the tip of each lead opposing the die pad has the thin portion with a gently inclined face formed by reducing the thickness to substantially a half of the thickness of the lead, the connecting regions with the metal wires can be less affected by stress applied to the lead externally or within the encapsulation resin. As a result, the reliability of the connection can be improved.

According to the method for fabricating a resin-encapsulation semiconductor device of this invention, since the tips of the inner leads opposing the die pad have the thin portions where the thickness is reduced in the upper faces thereof in the used lead frame, a semiconductor element having such a large size as to have its periphery close to the thin portions of the tips of the inner leads can be mounted. As a result, the chip area ratio in the resin-encapsulation semiconductor device can be increased for realizing a CSP, and thus, a resin-encapsulation semiconductor device with a small thickness can be fabricated.

Also, in the case where the used lead frame is composed of a plurality of lead units provided inside one metal plate outer frame and has the thin portions where the thickness is reduced between the respective lead units, the whole upper face over all the lead units of the lead frame can be encapsulated with an encapsulation resin. When the respective units are cut at the thin portions with the reduced thickness therebetween, the bases of the supporting leads and the inner leads can be cut, so as to obtain resin-encapsulation semiconductor devices each of which is in a rectangular parallelepiped shape and has the outside edges of the supporting leads and the inner leads disposed on the substantially same plane as the side face of the encapsulation resin. As a result, the fabrication efficiency for resin-encapsulation semiconductor devices can be improved.

DETAILED DESCRIPTION OF THE INVENTION

Preferred embodiments of a resin-encapsulation semiconductor device and a method for fabricating the same according to the invention will now be described with reference to the accompanying drawings.

Figure 1A:
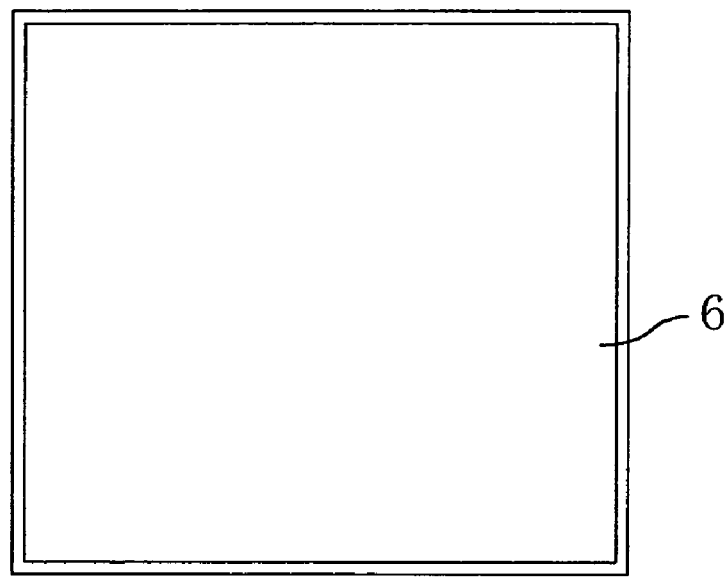
FIGS. 1A, 1B and 1C are diagrams of a resin-encapsulation semiconductor device according to an embodiment of the invention.
Figure 1B:
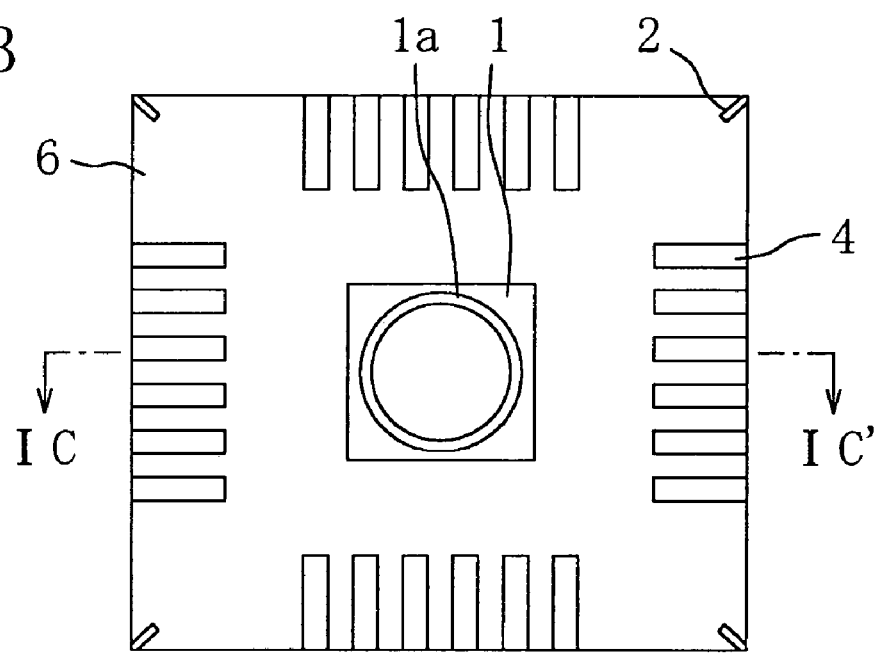
Figure 1C:
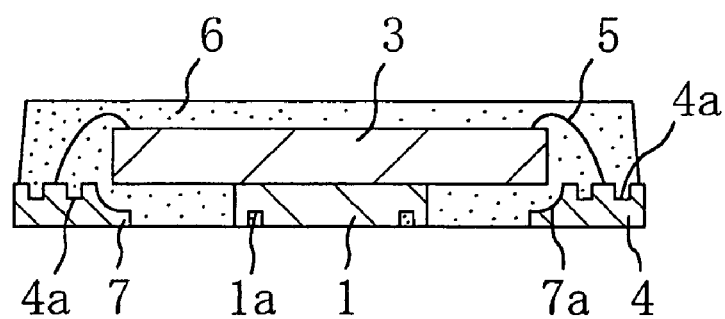

FIGS. 1A through 1C schematically show a resin-encapsulation semiconductor device according to one embodiment of the invention. FIG. 1A is a plan view of the resin-encapsulation semiconductor device, FIG. 1B is a bottom view thereof and FIG. 1C is a cross-sectional view thereof taken along line IC-IC' of FIG. 1B.

The resin-encapsulation semiconductor device of this embodiment, which uses a lead frame, principally aims at realizing a CSP by increasing a ratio of the chip area to the package area.

As shown in FIGS. 1A through 1C, the resin-encapsulation semiconductor device of this embodiment includes a die pad 1 for mounting a semiconductor element, a plurality of supporting leads 2 for supporting the die pad 1 at its respective corners, a semiconductor element 3 mounted on the die pad 1 with an adhesive, a plurality of inner leads 4 arranged to have their tips opposing the respective sides of the die pad 1 and each having grooves 4a on the upper face thereof, metal wires 5 for connecting electrodes of the semiconductor element 3 to bonding areas provided on the upper faces of the inner leads 4, and an encapsulation resin 6 for encapsulating the die pad 1 excluding the bottom thereof, the supporting leads 2, the semiconductor element 3, the inner leads 4 excluding the bottoms and outside edges thereof, and connecting regions with the metal wires 5. The outside edges of the inner leads 4 are disposed on the substantially same plane as the side face of the encapsulation resin 6, and the tip upper face of each inner lead 4 opposing the die pad 1 has a thin portion 7 with a reduced thickness. Also, the upper face of the die pad 1 and the upper faces of the inner leads 4 excluding the thin portions 7 are positioned at the same level.

This structure will be described in more detail. The tip of each inner lead 4 opposing the die pad 1 has an inclined portion 7a with a gently curved face, so as to be provided with the thin portion 7 with its upper face thinned to a thickness substantially a half of that of the inner lead 4. In this embodiment, the thin portion 7 is formed through half etching of each lead. Also, on the upper face of each inner lead 4, two grooves 4a are provided, so that each metal wire 5 for connecting the electrode of the semiconductor element 3 to the bonding area of the inner lead 4 can be connected to a portion in the vicinity of the grooves 4a and away from the thin portion 7 on the inner lead 4.

Accordingly, even when stress is applied to the inner lead 4, the stress can be effectively cancelled because the lead is deformed owing to the grooves 4a and the thin portion 7 has the inclined portion 7a, resulting in improving the reliability of the connection. In other words, the stress transmitted to the inner lead 4 can be gradually received by the inclined portion 7a of the thin portion 7 and cancelled by the grooves 4a through the deformation of the lead. Therefore, there is no need to provide a large number of grooves 4a on each inner lead 4, and hence, both compactness and reliability of the lead structure can be realized while securing the bonding areas.

Although the thin portion 7 is formed by reducing the thickness of the upper face of the lead through the inclined portion 7a with a gently curved face in this embodiment, the curved inclined portion 7a of the thin portion 7 can be a linearly inclined portion. Also, in the case where the connecting portion of the metal wire 5 is away from the thin portion 7, the thin portion 7 may be in a step-like shape having no inclined portion. The grooves 4a may be provided in any positions other than the thin portion 7 of the inner lead 4, and even when the grooves 4a are provided on the thin portion 7, the stress applied to the lead can be cancelled depending upon the lengths of the inner lead 4 and the thin portion 7.

Furthermore, in the resin-encapsulation semiconductor device of this embodiment, a groove 1a is formed on the bottom of the die pad 1. Thus, occurrence of resin burr can be prevented in the resin encapsulation. Accordingly, the encapsulation resin 6 never reaches the bottom of the die pad 1 exposed from the encapsulation resin 6, and the bottom of the die pad 1 can be definitely exposed.

Also, in the resin-encapsulation semiconductor device of this embodiment, the periphery of the semiconductor element 3 mounted on the die pad 1 is close to the thin portions 7 of the tip upper faces of the inner leads 4. Therefore, a semiconductor element having a larger area than a conventional one can be mounted, so that the area ratio of the semiconductor element 3 within the package (namely, the encapsulation resin 6) can be increased to 70% or more and more specifically up to 80%. Thus, a CSP can be realized.

Specifically, the tip upper face of each inner lead 4 opposing the die pad 1 has a small thickness so as to have the thin portion 7, and therefore, the periphery of the semiconductor element 3 mounted on the die pad 1 can be close to the thin portions 7 on the tip upper faces of the inner leads 4. As a result, a large semiconductor element can be mounted while avoiding contact between the inner leads 4 and the semiconductor element 3, so as to realize a CSP. In addition, since the tip upper faces of the inner leads 4 have the thin portions 7, there is no need to provide an elevated support on the die pad 1 for upsetting the semiconductor element, and the chip area ratio in the resin-encapsulation semiconductor device can be increased while reducing the thickness thereof. In this embodiment, the semiconductor element has a thickness of 200 μm and the resultant resin-encapsulation semiconductor device has a thickness of 0.5 mm.

In this embodiment, the tips of the inner leads 4 are close to the periphery of the semiconductor element 3. Alternatively, the thin portions 7 at the tips of the inner leads 4 may be extended below the mounted semiconductor element 3 or a semiconductor element having such a large size as to cover the tips of the inner leads 4 may be mounted.

Next, the method for fabricating a resin-encapsulation semiconductor device of this embodiment will be described with reference to FIGS. 2A, 2B and 3A through 3D.

Figure 2A:
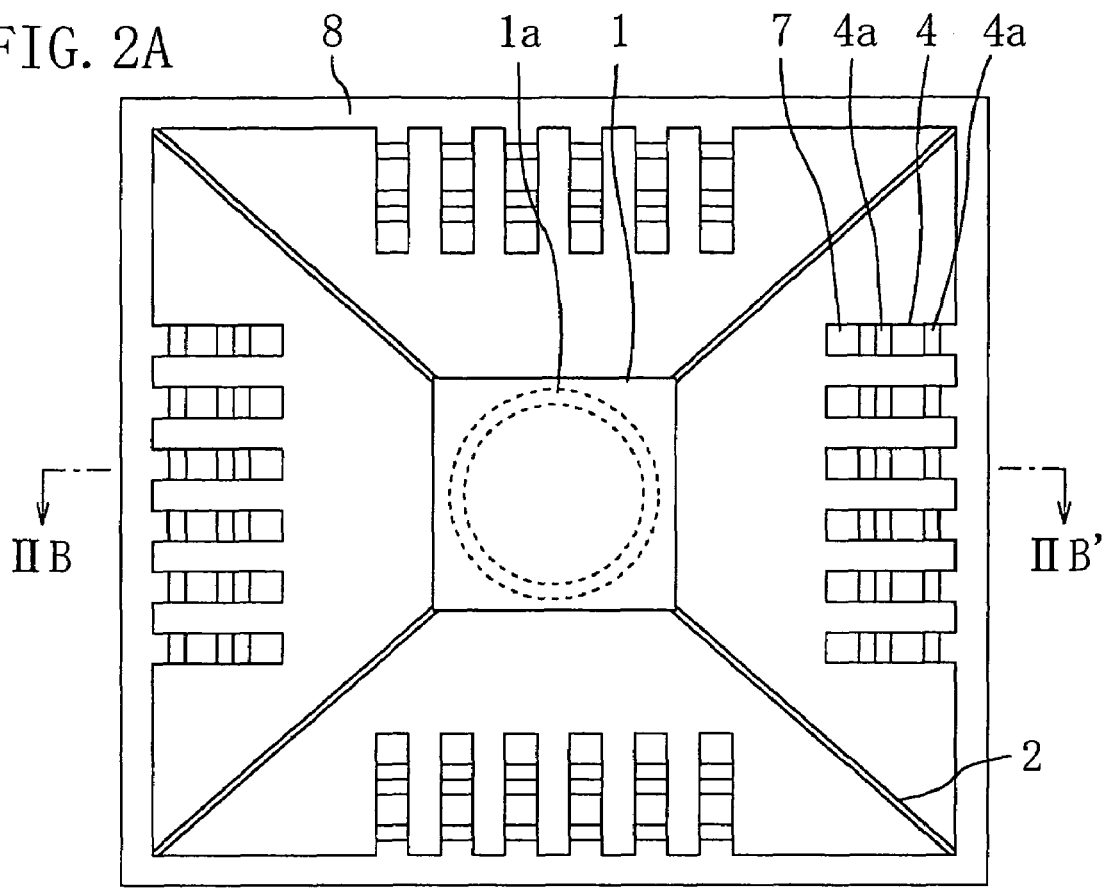
FIGS. 2A and 2B are diagrams of a lead frame used in a method for fabricating a resin-encapsulation semiconductor device according to the embodiment of the invention.
Figure 2B:
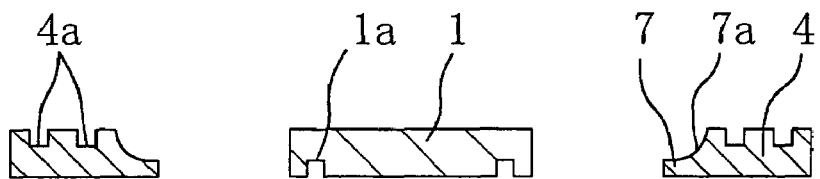

FIGS. 2A, 2B and 3A through 3D are diagrams for explaining the method for fabricating a resin-encapsulation semiconductor device of this embodiment. FIGS. 2A and 2B show a lead frame used in the fabrication method, and specifically, FIG. 2A is a plan view of the lead frame and FIG. 2B is a cross-sectional view thereof taken along line IIB-IIB' of FIG. 2A. FIGS. 3A through 3D are cross-sectional views for showing principal procedures in the fabrication method.

First, the lead frame used in the method for fabricating a resin-encapsulation semiconductor device of this embodiment will be described.

As shown in FIGS. 2A and 2B, the lead frame used in this embodiment includes, inside an outer frame 8, a die pad 1 for mounting a semiconductor element, supporting leads 2 and a plurality of inner leads 4. The outer frame 8 is made from a plate of a metal, such as copper or 42-alloy, generally used for a lead frame. The die pad 1 for mounting a semiconductor element is provided inside the outer frame 8. The supporting leads 2 support the corners of the die pad 1 at their tips and are connected to the outer frame 8 at their bases. The plural inner leads 4 are arranged so as to have their tips opposing the die pad 1 with the bases thereof connected to the outer frame 8.

In this embodiment, the tip upper face of each inner lead 4 opposing the die pad 1 has a thickness substantially halved through the half etching. Specifically, the tip of the inner lead 4 has a thin portion 7 with a thickness substantially a half of the thickness of the portion other than the tip. As shown in FIG. 2B, the tip upper face has a gently inclined portion 7a, so as to be provided with the thin portion 7 with the thickness substantially a half of the thickness of the inner lead 4.

Also, two grooves 4a are formed on the upper face of each inner lead 4, and a groove 1a in a circular ring shape is formed on the bottom of the die pad 1 as shown with broken lines in FIG. 2A. The lead frame has a thickness of 200 through 300 μm according to this embodiment, and one with a thickness of 250 μm is herein used.

Now, the procedures for fabricating a resin-encapsulation semiconductor device by using the lead frame will be described.

Figure 3A:
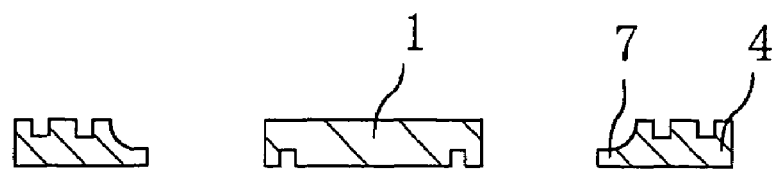
FIGS. 3A, 3B, 3C and 3D are cross-sectional views for showing procedures in the method for fabricating a resin-encapsulation semiconductor device according to the embodiment of the invention.

First, as shown in FIG. 3A, the lead frame is prepared. This lead frame includes, inside the outer frame made from a plate of a metal, such as copper or 42-alloy, generally used for a lead frame, the die pad 1 for mounting a semiconductor element, the supporting leads supporting the corners of the die pad 1 at their tips and connected to the outer frame at their bases, and the plural inner leads 4 opposing the die pad 1 at their tips and connected to the outer frame at their bases, and the tip of each inner lead 4 opposing the die pad 1 has the thin portion 7 with a reduced thickness in the upper face.

Figure 3B:
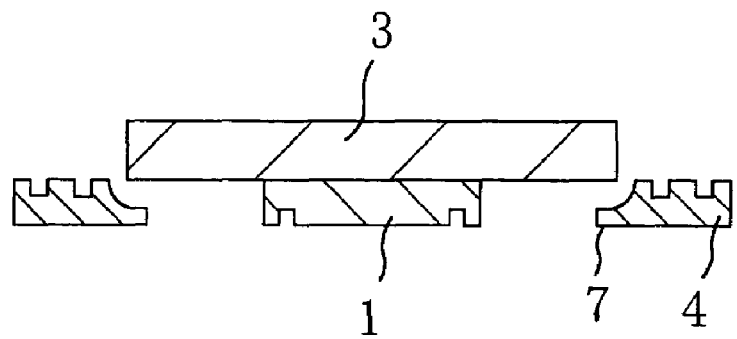

Next, as shown in FIG. 3B, a semiconductor element 3 is mounted, with the principal face thereof facing upward, on the die pad 1 of the prepared lead frame with an adhesive (not shown). At this point, since the tip upper faces of the inner leads 4 of the lead frame have the thin portions 7 with the reduced thickness in this embodiment, even when the mounted semiconductor element 3 has such a large area as to cover the vicinity of the tips of the inner leads 4 or cover even the thin portions 7, the semiconductor element 3 can be mounted without being in contact with the inner leads 4.

Figure 3C:
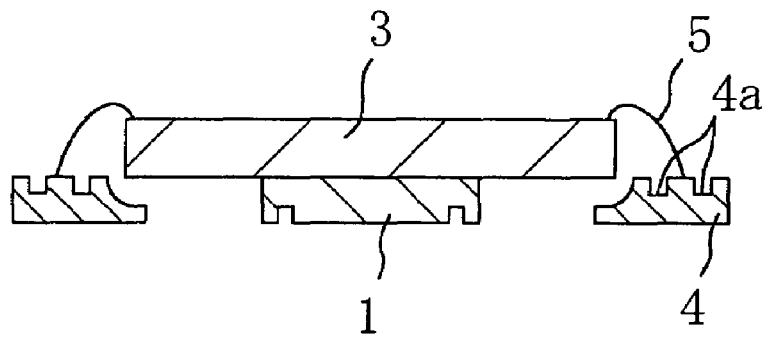

Then, as shown in FIG. 3C, each electrode of the semiconductor element 3 mounted on the die pad 1 is electrically connected, through a metal wire 5, to a portion on the upper face of the inner lead 4 other than the thin portion, for example, to a space between the grooves 4a. At this point, the metal wire 5 for connecting the electrode of the semiconductor element 3 to the upper face of the inner lead 4 is connected to a portion in the vicinity of the grooves 4a and away from the thin portion 7 on the upper face of the inner lead 4. This is because the metal wire 5 should not be connected to the thin portion 7 for canceling stress.

Figure 3D:
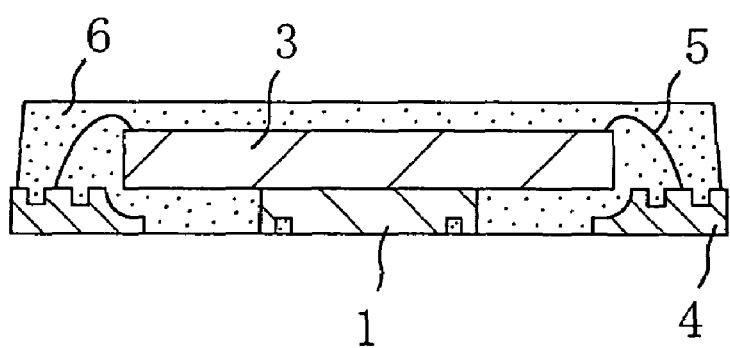

Thereafter, as shown in FIG. 3D, the upper face of the lead frame is resin encapsulated with an encapsulation resin 6, so as to encapsulate the die pad 1 excluding the bottom thereof, the supporting leads, the semiconductor element 3, the inner leads 4 excluding the bottoms thereof and connecting regions with the metal wires 5. After the resin encapsulation, the bases of the supporting leads and the inner leads 4 are cut, so that the outside edges of the supporting leads and the inner leads 4 can be disposed on the substantially same plane as the side face of the encapsulation resin 6. Thus, the resin-encapsulation semiconductor device is completed. This resin encapsulation is performed with an encapsulation sheet adhered onto the bottom of the lead frame for realizing one side encapsulation, and a portion of the die pad 1 and the like, which are desired to be exposed from the encapsulation resin 6, can be definitely exposed.

In the method for fabricating a resin-encapsulation semiconductor device of this embodiment, since the used lead frame includes the thin portions 7 with the reduced thickness in the tip upper faces of the inner leads 4 opposing the die pad 1, the semiconductor element 3 having such a large area as to have its periphery in the vicinity of the thin portions 7 on the tip upper faces of the inner leads 4 can be mounted. Therefore, the chip area ratio can be increased in the resin-encapsulation semiconductor device so as to realize a CSP. Also, there is no need to subject the die pad 1 to the upsetting processing, the resultant resin-encapsulation semiconductor device can attain a very small thickness.

Figure 4A:
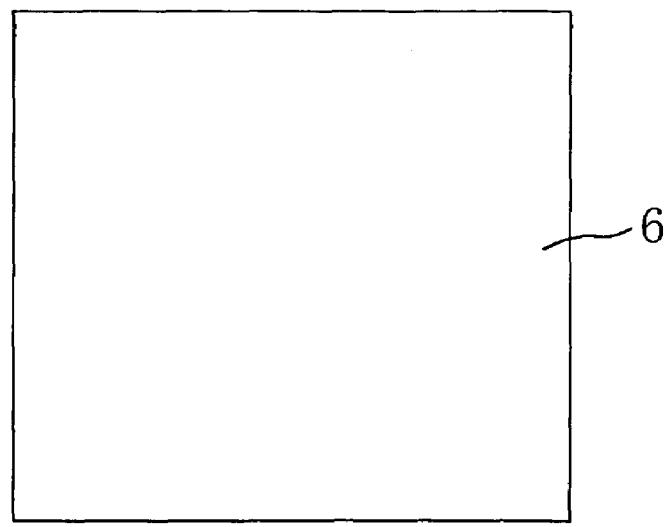
FIGS. 4A, 4B and 4C are diagrams of a resin-encapsulation semiconductor device according to another embodiment of the invention.
Figure 4B:
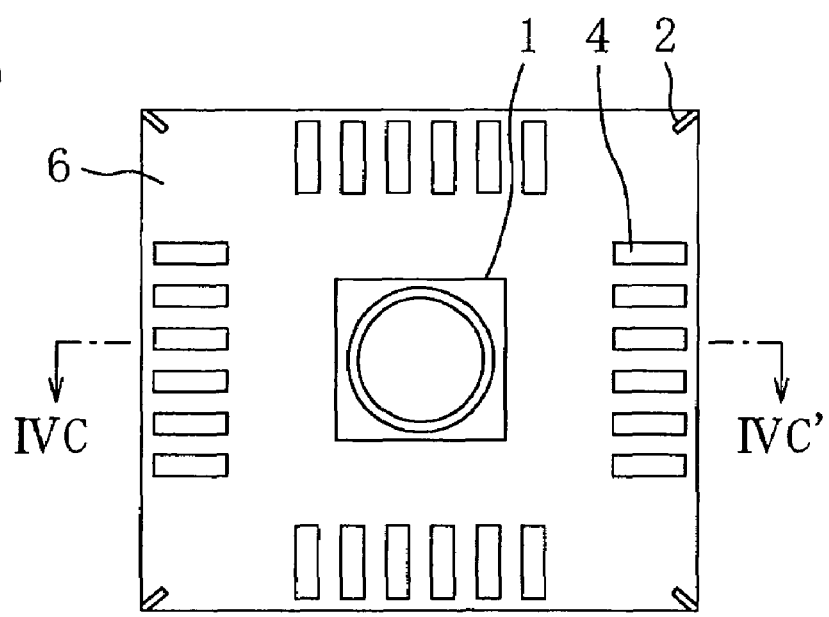
Figure 4C:
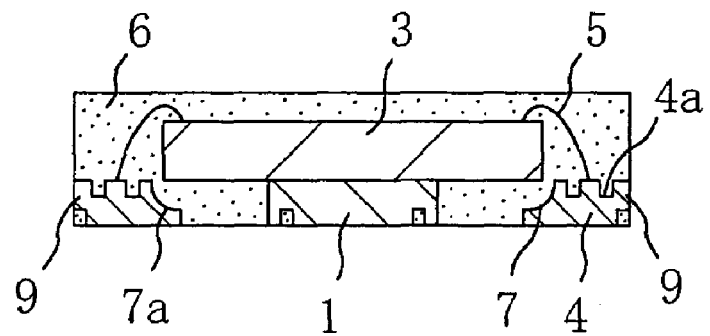

Now, a resin-encapsulation semiconductor device according to another embodiment of the invention will be described with reference to FIGS. 4A through 4C. FIGS. 4A through 4C show the resin-encapsulation semiconductor device of this embodiment, and specifically, FIG. 4A is a plan view of the resin-encapsulation semiconductor device, FIG. 4B is a bottom view thereof and FIG. 4C is a cross-sectional view thereof taken along line IVC-IVC' of FIG. 4B.

The basic structure of the resin-encapsulation semiconductor device of FIGS. 4A through 4C is the same as that of the resin-encapsulation semiconductor device shown in FIGS. 1A through 1C. Specifically, this resin-encapsulation semiconductor device includes a die pad 1 for mounting a semiconductor element; a plurality of supporting leads 2 for supporting the corners of the die pad 1; a semiconductor element 3 mounted on the die pad 1 with an adhesive; a plurality of inner leads 4 arranged to oppose the respective sides of the die pad 1 at the tips thereof and each having grooves 4a on the upper face thereof; metal wires 5 for connecting electrodes of the semiconductor element 3 to bonding areas provided on the upper faces of the inner leads 4; and an encapsulation resin 6 for encapsulating the die pad 1 excluding the bottom thereof, the supporting leads 2, the semiconductor element 3, the inner leads 4 excluding the bottoms and the outside edges thereof and connecting regions with the metal wires 5. The outside edges of the inner leads 4 are disposed on substantially the same plane as the side face of the encapsulation resin 6. The tip of each inner lead 4 opposing the die pad 1 has a thin portion 7 with a reduced thickness in its upper face. The tip upper face has a gently inclined portion 7a so as to be provided with the thin portion 7 having a thickness substantially a half of the thickness of the inner lead 4.

The resin-encapsulation semiconductor device of FIGS. 4A through 4C is different from that shown in FIGS. 1A through 1C in including a thin portion 9 with a reduced thickness in lower faces of the inner leads 4 at the outside edges thereof. The thin portion 9 has a rectangular outline and has an outside edge disposed on the same plane as the side face of the encapsulation resin 6. Accordingly, in the resin-encapsulation semiconductor device of this embodiment, the lower faces at the outside edges of the inner leads 4 are encapsulated within the encapsulation resin 6 as shown in FIG. 4C. Therefore, the bottoms of the inner leads 4 are not exposed in the periphery of the encapsulation resin 6 (namely, the package).

Now, a method for fabricating a resin-encapsulation semiconductor device of this embodiment will be described.

Figure 5A:
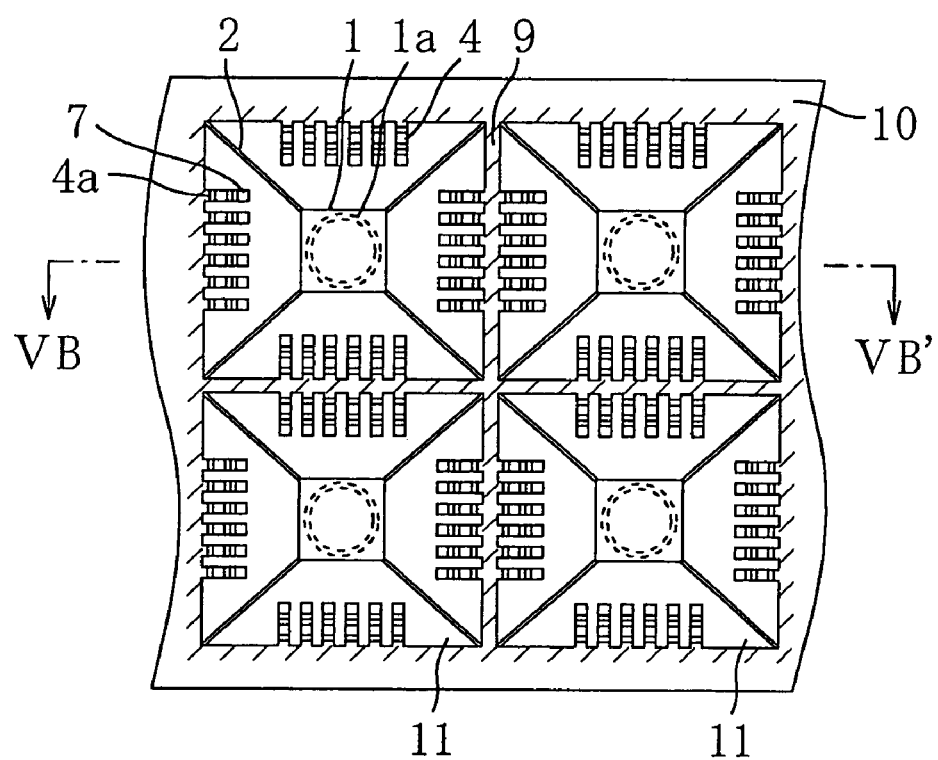
FIGS. 5A and 5B are diagrams of a lead frame used in a method for fabricating a resin-encapsulation semiconductor device according to the latter embodiment of the invention.
Figure 5B:
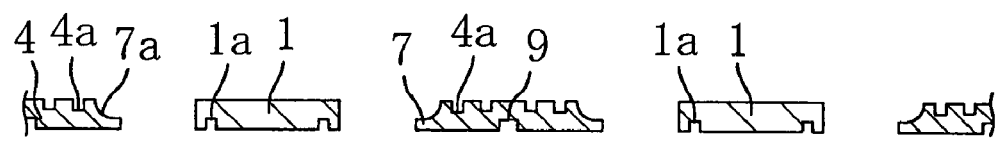

FIGS. 5A, 5B, 6A through 6E and 7 are diagrams for explaining the method for fabricating a resin-encapsulation semiconductor of this embodiment. FIGS. 5A and 5B show a lead frame used in the fabrication method, and specifically, FIG. 5A is a plan view of the lead frame and FIG. 5B is a cross-sectional view thereof taken along line VB-VB' of FIG. 5A. FIGS. 6A through 6E and 7 are cross-sectional views for showing principal procedures in the fabrication method.

First, the lead frame used in the method for fabricating a resin-encapsulation semiconductor device of this embodiment will be described.

As shown in FIGS. 5A and 5B, the lead frame used in this embodiment includes a plurality of lead units 11 each used as a unit of lead frame, and has, between the respective lead units 11, thin portions 9 where an outer frame 10 has a reduced thickness. Each lead unit 11 is a lead frame that is provided inside the outer frame 10 made from any of the aforementioned metal plates. Each lead unit 11 includes a die pad 1 for mounting a semiconductor element; supporting leads 2 supporting the die pad 1 at the tips and connected to the outer frame 10 at the bases; and inner leads 4 arranged so as to have their tips opposing the die pad 1, connected to the outer frame 10 at their bases and having thin portions 7 with a reduced thickness at the tip upper faces thereof opposing the die pad 1.

In FIG. 5A, the thin portions 9 between the respective lead units 11 are shown as hatched portions for convenience. Specifically, the lead frame used in this embodiment is a large lead frame substrate for wholly encapsulating the upper face thereof. Also, similarly to the above-described embodiment, grooves 4a are provided on the upper face of each inner lead 4 and a groove 1a shown with broken lines is provided on the bottom of each die pad 1.

Now, the procedures for fabricating a resin-encapsulation semiconductor device by using the lead frame will be described.

Figure 6A:
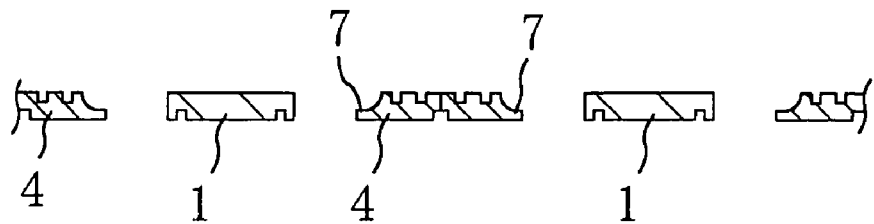
FIGS. 6A, 6B, 6C, 6D and 6E are cross-sectional views for showing procedures in the method for fabricating a resin-encapsulation semiconductor device according to the latter embodiment of the invention.

First, as shown in FIG. 6A, the lead frame shown in FIGS. 5A and 5B is prepared. Specifically, the prepared lead frame is composed of lead units each including the die pad 1 for mounting a semiconductor element; the supporting leads supporting the corners of the die pad at their tips and connected to the outer frame at their bases; and the plural inner leads having the tips opposing the die pad 1, connected to the outer frame at their bases and having the thin portions 7 with a reduced thickness at the tip upper faces thereof opposing the die pad 1.

Figure 6B:
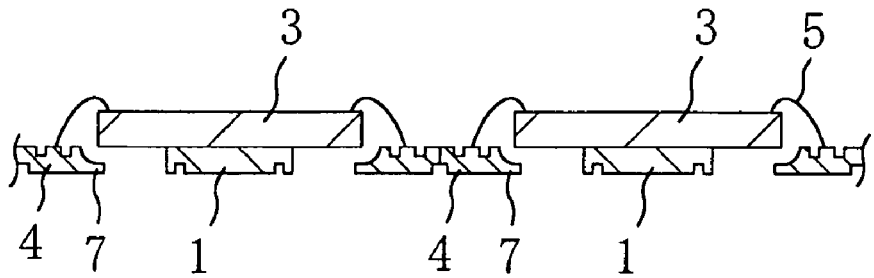

Next, as shown in FIG. 6B, a semiconductor element 3 is mounted, with its principal face facing upward, on the die pad 1 of each lead unit of the prepared lead frame with an adhesive (not shown). At this point, since the tip upper faces of the tips of the inner leads 4 of each lead unit have the thin portions 7 with the reduced thickness, even the semiconductor element 3 having such a large area as to cover the vicinity of the tips of the inner leads 4 or cover even the thin portions 7 can be mounted without being in contact with the inner leads 4.

Figure 6C:
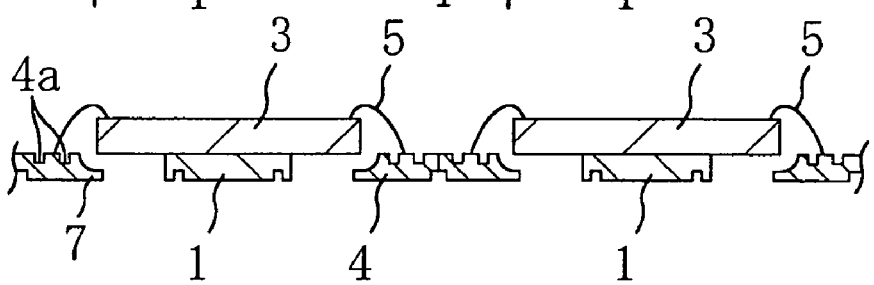

Then, as shown in FIG. 6C, electrodes of the semiconductor element 3 mounted on the die pad 1 of each lead unit are electrically connected, through metal wires 5, to portions on the upper faces of the inner leads 4 excluding the thin portions, for example, to spaces between the grooves 4a. Each metal wire 5 for connecting the electrode of the semiconductor element 3 to the upper face of the inner lead 4 is connected to a portion in the vicinity of the grooves 4a provided on the upper face of the inner lead 4 and away from the thin portion 7. This is because the metal wire 5 should not be connected to the thin portion 7 for canceling stress.

Figure 6D:
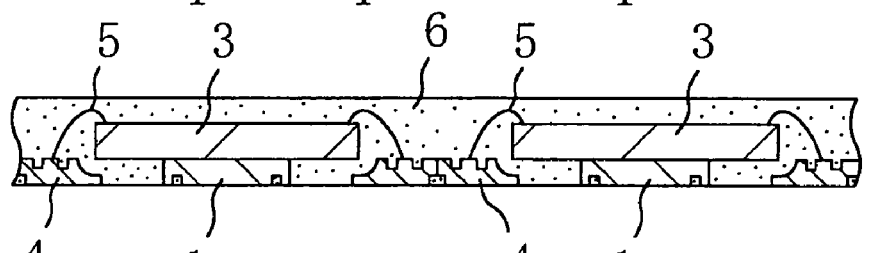

Thereafter, as shown in FIG. 6D, the whole upper faces of the respective lead units of the lead frame are resin encapsulated with an encapsulation resin 6, so as to encapsulate the die pad 1 excluding the bottom thereof, the supporting leads, the semiconductor element 3, the inner leads 4 excluding the bottoms thereof and connecting regions with the metal wires 5. In this resin encapsulation, an encapsulation sheet is adhered onto the bottom of the lead frame for realizing the one side encapsulation, so as to definitely expose portions desired to be exposed from the encapsulation resin 6, such as the bottom of the die pad 1.

Figure 6E:
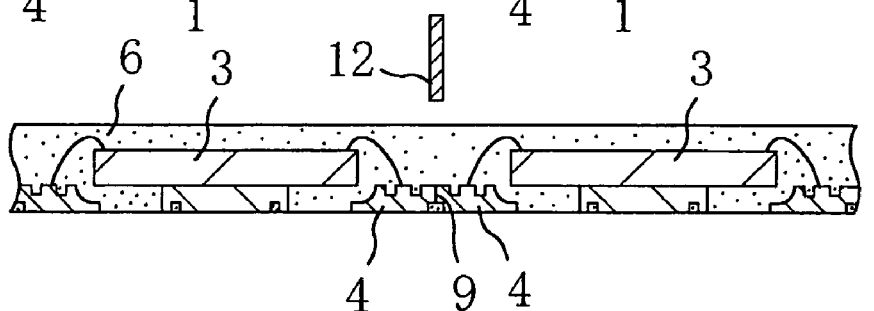

Subsequently, as shown in FIG. 6E, the lead frame is cut, with a dicing blade 12, into respective units each including the semiconductor element 3 at the thin portions 9 with the reduced thickness between the respective lead units, so as to cut the bases of the supporting leads and the inner leads 4. As a result, individual resin-encapsulation semiconductor devices each in a rectangular parallelepiped shape and having the outside edges of the supporting leads and the inner leads 4 disposed on the substantially same plane as the side face of the encapsulation resin 6 can be obtained.

Figure 7:
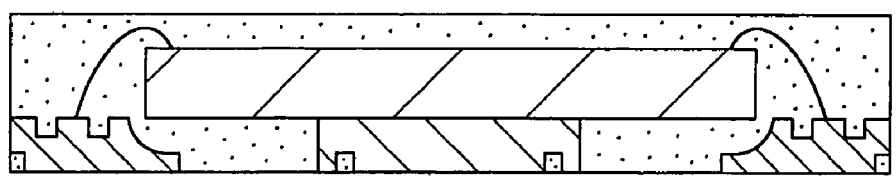
FIG. 7 is a cross-sectional view for explaining the method for fabricating a resin-encapsulation semiconductor device according the latter embodiment of the invention.
Figure 8A:
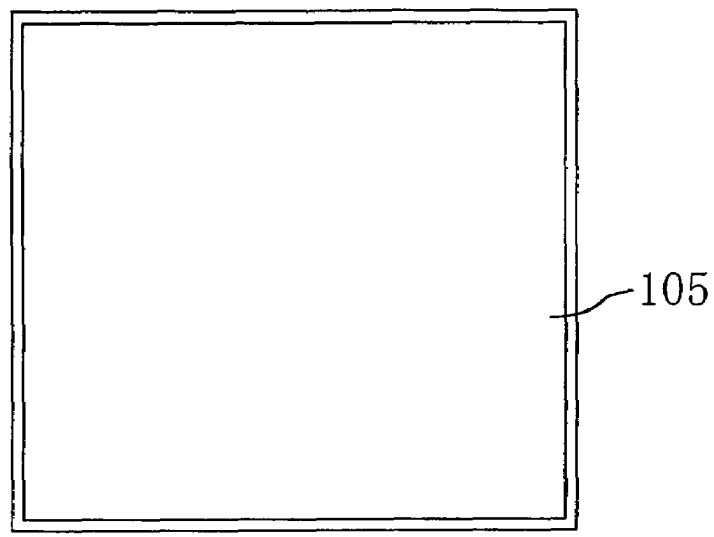
FIGS. 8A, 8B and 8C are diagrams of a conventional resin-encapsulation semiconductor device.
Figure 8B:
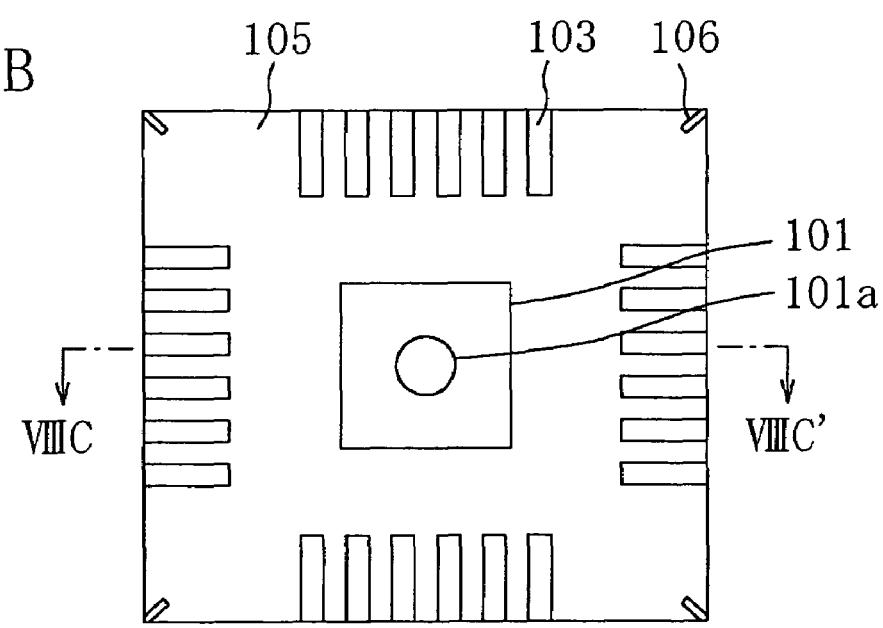
Figure 8C:
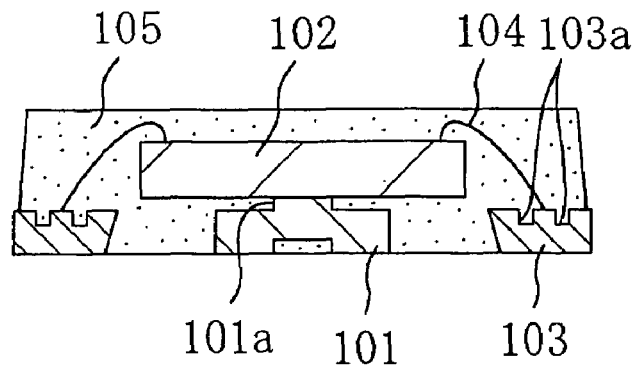
Figure 9A:
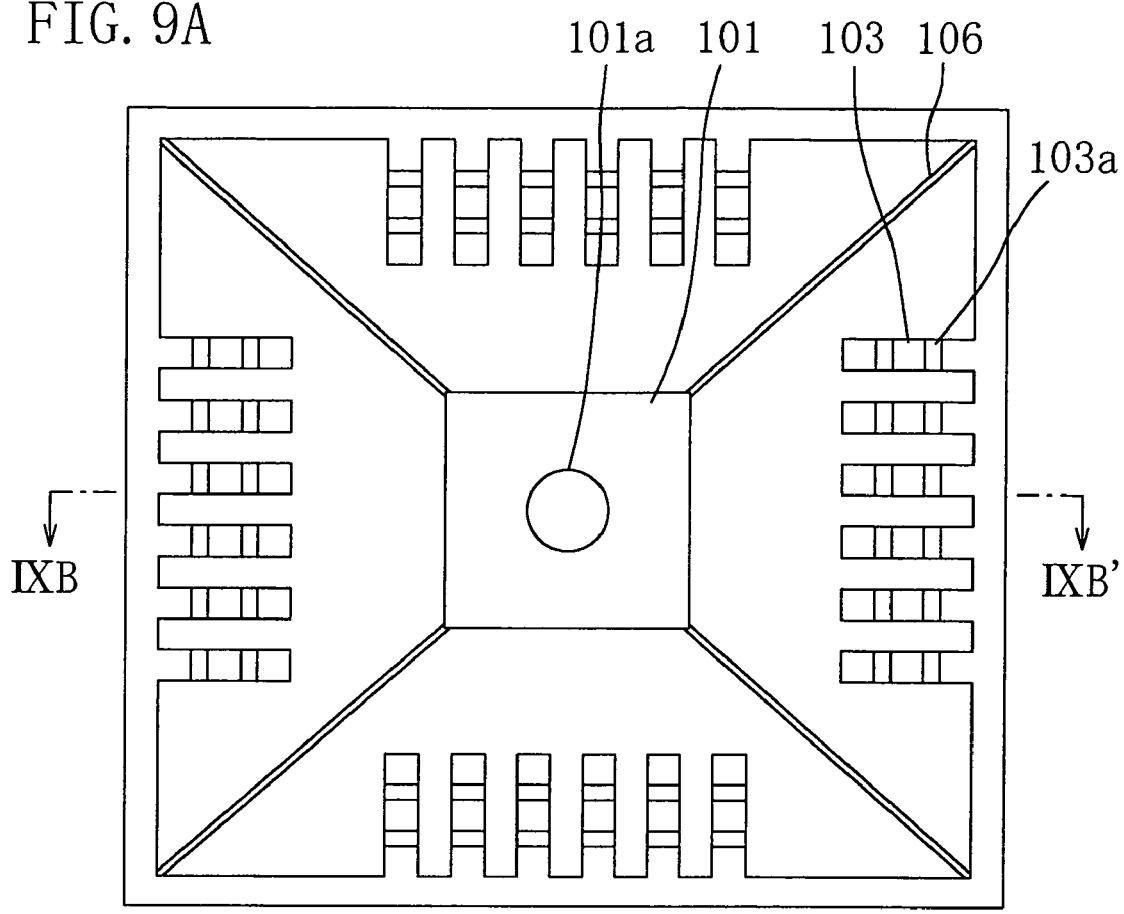
FIGS. 9A and 9B are diagrams of a lead frame used in a method for fabricating the conventional resin-encapsulation semiconductor device.
Figure 9B:
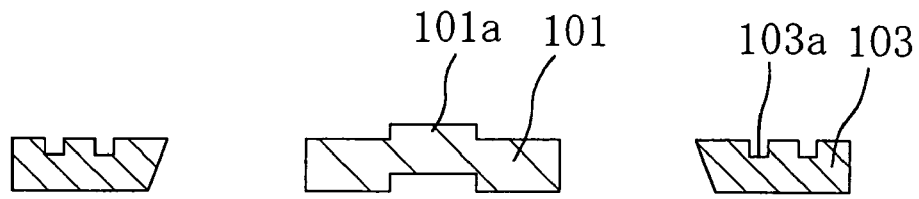
Figure 10A:
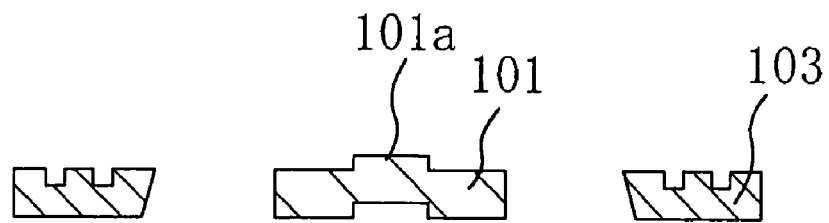
FIGS. 10A, 10B, 10C and 10D are cross-sectional views for showing procedures in the method for fabricating the conventional resin-encapsulation semiconductor device.
Figure 10B:
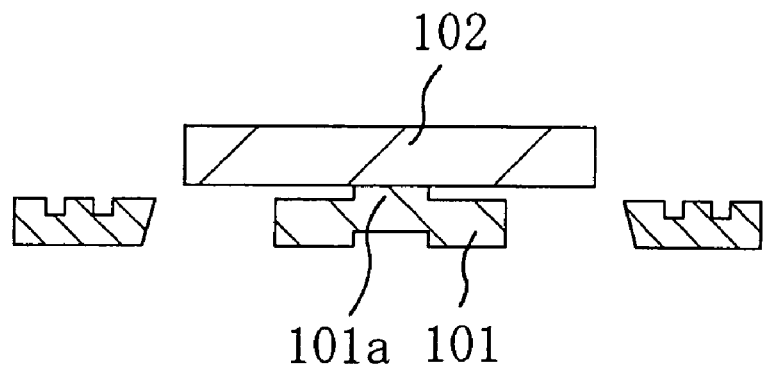
Figure 10C:
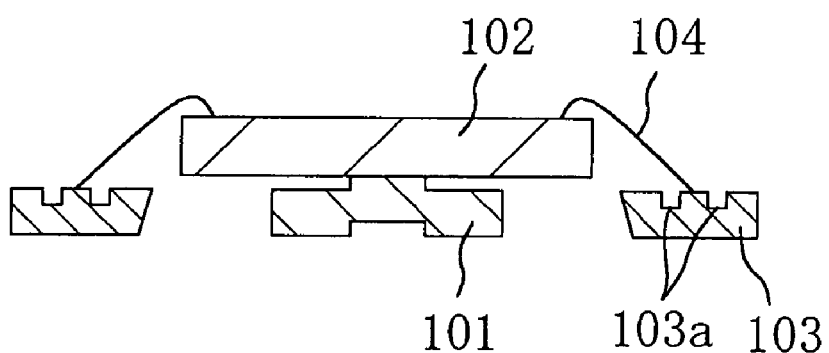
Figure 10D:
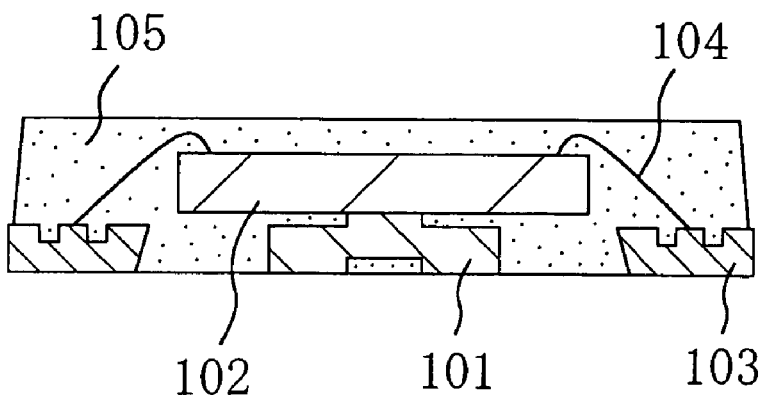

The rectangular parallelepiped resin-encapsulation semiconductor device cut out from the lead frame is shown in FIG. 7. The resin-encapsulation semiconductor device of FIG. 7 has the same structure as that shown in FIGS. 4A through 4C.

In this manner, in the resin-encapsulation semiconductor device of this embodiment, since the tips of the inner leads opposing the die pad have the thin portions where the thickness is reduced in the upper faces thereof, the periphery of the semiconductor element mounted on the die pad can be close to the tip upper faces of the inner leads. Therefore, a large semiconductor element can be mounted without being in contact with the inner leads, so as to increase the chip area ratio for realizing a CSP. Furthermore, since the tips of the inner leads have the thin portions, there is no need to upset the semiconductor element by providing an elevated support on the die pad, and therefore, the resultant resin-encapsulation semiconductor device can attain a further smaller thickness.

Also, in the method for fabricating a resin-encapsulation semiconductor device, since the tips of the inner leads opposing the die pad have the thin portions with the reduced thickness in their upper faces in the used lead frame, a semiconductor device having such a large size as to have its periphery close to the thin portions of the tip upper faces of the inner leads can be mounted. As a result, the chip area ratio in the resin-encapsulation semiconductor device can be increased for realizing a CSP, and thus, a thin resin-encapsulation semiconductor device can be fabricated.

Moreover, in the case where the used lead frame is composed of a plurality of lead units provided inside one metal plate outer frame and has the thin portions with the reduced thickness between the respective lead units, the entire upper face over all the lead units of the lead frame can be encapsulated with an encapsulation resin. When the respective units are cut at the thin portions with the reduced thickness therebetween, the bases of the supporting leads and the inner leads can be cut, so as to obtain resin-encapsulation semiconductor devices each of which is in a rectangular parallelepiped shape and has the outside edges of the supporting leads and the inner leads disposed on the substantially same plane as the side face of the encapsulation resin. In other words, the efficiency in the resin encapsulating and the cutting procedures can be improved so as to realize a fabrication method with high productivity.

As described above, according to the resin-encapsulation semiconductor device of this invention, since the tips of the leads opposing the die pad have the thin portions where the thickness is reduced in the upper faces thereof, the periphery of a semiconductor element mounted on the die pad can be close to the tip upper faces of the leads. Therefore, a large semiconductor element can be mounted without being in contact with the leads, so as to increase the chip area ratio for realizing a CSP. Furthermore, since the tips of the leads have the thin portions, there is no need to upset the semiconductor element by providing an elevated support on the die pad, and therefore, the resultant resin-encapsulation semiconductor device can attain a further smaller thickness. In addition, in the case where the tip of each lead has the thin portion with a gently inclined face formed by reducing the thickness to substantially a half of the thickness of the lead, the connecting regions with the metal wires can be less affected by stress applied to the lead externally or within the encapsulation resin. As a result, the reliability of the connection can be improved.

According to the method for fabricating a resin-encapsulation semiconductor device of this invention, since the tips of the inner leads opposing the die pad have the thin portions where the thickness is reduced in the upper faces thereof in the used lead frame, a semiconductor element having such a large size as to have its periphery close to the thin portions of the tips of the inner leads can be mounted. As a result, the chip area ratio in the resin-encapsulation semiconductor device can be increased for realizing a CSP, and thus, the fabrication method capable of thickness reduction can be provided. Also, in the case where the used lead frame is composed of a plurality of lead units provided inside one metal plate outer frame and has the thin portions with the reduced thickness between the respective lead units, the whole upper face over all the lead units of the lead frame can be encapsulated with an encapsulation resin. When the respective units are cut at the thin portions with the reduced thickness therebetween, the bases of the supporting leads and the inner leads can be cut, so as to obtain resin-encapsulation semiconductor devices each of which is in a rectangular parallelepiped shape and has the outside edges of the supporting leads and the inner leads disposed on the substantially same plane as the side face of the encapsulation resin. As a result, the fabrication efficiency for resin-encapsulation semiconductor devices can be improved.

What is claimed is:

1. A method for fabricating a resin-encapsulation semiconductor device comprising the steps of:

preparing a lead frame including a die pad provided inside an outer frame made from a plate material for mounting a semiconductor element, supporting leads supporting the die pad at tips thereof and connected to the outer frame at bases thereof, and a plurality of leads arranged to have tips thereof opposing the die pad, connected to the outer frame at bases thereof and having, at the tips thereof, thin portions having a reduced thickness in upper faces thereof;

mounting, on the die pad of the prepared lead frame, a semiconductor element having a principal plane where electrodes are disposed, with the principal plane thereof facing upward;

connecting, through metal wires, the electrodes of the semiconductor element mounted on the die pad to upper faces of the leads of the lead frame in positions other than upper faces of the thin portions; and resin encapsulating an upper face of the lead frame with an encapsulation resin for encapsulating the die pad excluding a bottom thereof, the leads excluding bottoms thereof, connecting regions with the metal wires, the supporting leads and the semiconductor elements, wherein each of the tips of the leads opposing the die pad has a thin portion where a thickness is reduced in an upper face thereof, and entire lower faces of the leads are planar.

2. The method for fabricating a resin-encapsulation semiconductor device of claim 1, further comprising, after the step of resin encapsulating, a step of cutting the bases of the supporting leads and the leads, whereby disposing outside edges of the supporting leads and the leads in substantially the same plane as a side face of the encapsulation resin.

3. The method for fabricating a resin-encapsulation semiconductor device of claim 1, wherein, in the step of mounting a semiconductor element on the die pad, the semiconductor element has such a size as to have a periphery thereof close to the thin portions of the tips of the leads of the lead frame.

4. A method for fabricating a resin-encapsulation semiconductor device comprising the steps of:

preparing a lead frame including a plurality of lead units provided inside an outer frame made from a plate material, each of the lead units including a die pad for mounting a semiconductor element, supporting leads supporting the die pad at tips thereof and connected to the outer frame at bases thereof, and a plurality of leads arranged to have tips thereof opposing the die pad, connected to the outer frame at bases thereof and having, at the tips thereof, thin portions having a reduced thickness in upper faces thereof, and the outer frame having a reduced thickness between the lead units;

mounting, on each die pad of the prepared lead frame, a semiconductor element having a principal plane where electrodes are disposed, with the principal plane thereof facing upward;

connecting, through metal wires, the electrodes of the semiconductor element mounted on the die pad to upper faces of the leads of the lead frame in positions other than upper faces of the thin portions;

resin encapsulating an upper face of the lead frame over the lead unites with an encapsulation resin for encapsulating the die pad excluding a bottom thereof, the leads excluding bottoms thereof, connecting regions with the metal wires, the supporting leads and the semiconductor element; and cutting the bases of the supporting leads and the leads by cutting the lead frame in portions where the outer frame has the reduced thickness between the lead units, whereby obtaining resin-encapsulation semiconductor devices each of which is in a rectangular parallelepiped shape and has outside edges of the supporting leads and the leads disposed in substantially the same plane as a side face of the encapsulation resin, wherein each of the tips of the leads opposing the die pad has a thin portion where a thickness is reduced in an upper face thereof, and entire lower faces of the leads are planar.

5. The method for fabricating a resin-encapsulation semiconductor device of claim 4, wherein, in the step of mounting a semiconductor element, the semiconductor element has such a size as to have a periphery thereof close to the thin portions of the tips of the leads of the lead frame.

* * * * *